United States Patent [19]
Hosotani et al.

[11] Patent Number: 5,225,837
[45] Date of Patent: Jul. 6, 1993

[54] A/D CONVERTER

[75] Inventors: Shiro Hosotani; Takahiro Miki; Masao Ito, all of Hyogo, Japan

[73] Assignee: Mitsubishi Denki Kabushiki Kaisha, Tokyo, Japan

[21] Appl. No.: 706,834

[22] Filed: May 29, 1991

[30] Foreign Application Priority Data

Jun. 26, 1990 [JP] Japan .................................. 2-167284

[51] Int. Cl.$^5$ ............................................. H03M 1/36
[52] U.S. Cl. ..................................... 341/159; 341/158
[58] Field of Search ............... 341/159, 155, 131, 132, 341/126, 138, 158, 150

[56] References Cited

U.S. PATENT DOCUMENTS

| | | | |
|---|---|---|---|
| 3,242,348 | 3/1966 | Sem-Sandberg et al. | 341/154 X |
| 4,058,806 | 11/1977 | Nadler | 341/159 |
| 4,618,847 | 10/1986 | Iida et al. | 341/154 X |
| 4,837,572 | 6/1989 | Gulczynski | 341/150 |
| 4,928,102 | 5/1990 | Katzenstein | 341/138 X |
| 4,994,808 | 2/1991 | Wichelman | 341/161 |

FOREIGN PATENT DOCUMENTS

62111525 11/1985 Japan .

OTHER PUBLICATIONS

Maio et al., "A 500 MHz 8b DAC", IEEE Journal of Solid-State Circuits, Feb. 13, 1985, pp. 78–80.
Joey Doernberg et al., "A 10-bit 5-Msample/S CMOS Two-Step Flash ADC", IEEE Journal of Solid-State Circuits, vol. 24, No. 2, Apr., 1989, pp. 241–249.

*Primary Examiner*—Sharon D. Logan
*Attorney, Agent, or Firm*—Lowe, Price, LeBlanc & Becker

[57] ABSTRACT

An A/D converter includes a resistor network generating a reference voltage, a level detector for detecting the level of an input analogue signal with a reference voltage from the resistor network as a reference, and an encoder for providing a digital signal by encoding the output of the level detector. The level detector includes a plurality of comparators for bilevel-processing the input analogue signal with a preselected voltage from the resistor connection nodes of the resistor network as a reference voltage. The resistor network comprises a plurality of resistor elements between a first node receiving a first reference voltage and a second node receiving a second reference voltage, which are interconnected to provide a voltage from an associated connection node that is $1/\!\!/$ times the difference between said first reference voltage and said second reference voltage. The comparator includes capacitors for providing the difference between the input analogue signal and the reference voltage by a capacitor coupling, and an inverter amplifier for determining the positive or negative of the voltage change generated by the capacitors. This structure implements an A/D converter of high precision with less elements.

23 Claims, 11 Drawing Sheets

FIG. 4  PRIOR ART

| COMPARATOR NUMBER # | 10 | 9 | 8 | 7 | Va - VB |
|---|---|---|---|---|---|
| 14 | N4 | N4 | N4 | N3 | $15 V_{ref}/16 - V_{in}$ |
| 13 | N4 | N4 | N3 | N3 | $14 V_{ref}/16 - V_{in}$ |
| 12 | N4 | N3 | N3 | N3 | $13 V_{ref}/16 - V_{in}$ |
| 11 | N3 | N3 | N3 | N3 | $12 V_{ref}/16 - V_{in}$ |
| 10 | N3 | N3 | N3 | N2 | $11 V_{ref}/16 - V_{in}$ |
| 9 | N3 | N3 | N2 | N2 | $10 V_{ref}/16 - V_{in}$ |
| 8 | N3 | N2 | N2 | N2 | $9 V_{ref}/16 - V_{in}$ |
| 7 | N2 | N2 | N2 | N2 | $8 V_{ref}/16 - V_{in}$ |
| 6 | N2 | N2 | N2 | N1 | $7 V_{ref}/16 - V_{in}$ |
| 5 | N2 | N2 | N1 | N1 | $6 V_{ref}/16 - V_{in}$ |
| 4 | N2 | N1 | N1 | N1 | $5 V_{ref}/16 - V_{in}$ |
| 3 | N1 | N1 | N1 | N1 | $4 V_{ref}/16 - V_{in}$ |
| 2 | N1 | N1 | N1 | N0 | $3 V_{ref}/16 - V_{in}$ |
| 1 | N1 | N1 | N0 | N0 | $2 V_{ref}/16 - V_{in}$ |
| 0 | N1 | N0 | N0 | N0 | $V_{ref}/16 - V_{in}$ |

FIG. 7

| COMPARATOR NUMBER # | 10 | 9 | 8 | 7 | $V_a - V_B$ |
|---|---|---|---|---|---|
| 14 | N4 | N3 | N2 | N1 | $\frac{1}{4}(15V_{ref}/16 - V_{in})$ |
| 13 | N4 | N3 | N2 | * | $\frac{1}{4}(14V_{ref}/16 - V_{in})$ |
| 12 | N4 | N3 | * | N1 | $\frac{1}{4}(13V_{ref}/16 - V_{in})$ |
| 11 | N4 | N3 | * | * | $\frac{1}{4}(12V_{ref}/16 - V_{in})$ |
| 10 | N4 | * | N2 | N1 | $\frac{1}{4}(11V_{ref}/16 - V_{in})$ |
| 9 | N4 | * | N2 | * | $\frac{1}{4}(10V_{ref}/16 - V_{in})$ |
| 8 | N4 | * | * | N1 | $\frac{1}{4}(9V_{ref}/16 - V_{in})$ |
| 7 | N4 | * | * | * | $\frac{1}{4}(8V_{ref}/16 - V_{in})$ |
| 6 | * | N3 | N2 | N1 | $\frac{1}{4}(7V_{ref}/16 - V_{in})$ |
| 5 | * | N3 | N2 | * | $\frac{1}{4}(6V_{ref}/16 - V_{in})$ |
| 4 | * | N3 | * | N1 | $\frac{1}{4}(5V_{ref}/16 - V_{in})$ |
| 3 | * | N3 | * | * | $\frac{1}{4}(4V_{ref}/16 - V_{in})$ |
| 2 | * | * | N2 | N1 | $\frac{1}{4}(3V_{ref}/16 - V_{in})$ |
| 1 | * | * | N2 | * | $\frac{1}{4}(2V_{ref}/16 - V_{in})$ |
| 0 | * | * | * | N1 | $\frac{1}{4}(V_{ref}/16 - V_{in})$ |

\* DENOTES $N_0$

FIG.10

| COMPARATOR NUMBER # | COMPARATOR INPUT NODE ||||||  Va − VB |
|---|---|---|---|---|---|---|---|
| | 19 | 18 | 17 | 16 | 15 | 14 | |
| 62 | N6 | N6 | N6 | N5 | N2 | N1 | $\frac{4}{6}(63V_{ref}/64 - V_{in})$ |
| 61 | N6 | N6 | N6 | N5 | N2 | * | $\frac{4}{6}(62V_{ref}/64 - V_{in})$ |
| 60 | N6 | N6 | N6 | N5 | X | N1 | $\frac{4}{6}(61V_{ref}/64 - V_{in})$ |
| 59 | N6 | N6 | N6 | N5 | * | * | $\frac{4}{6}(60V_{ref}/64 - V_{in})$ |
| 58 | N6 | N6 | N5 | N5 | N2 | N1 | $\frac{4}{6}(59V_{ref}/64 - V_{in})$ |
| 57 | N6 | N6 | N5 | N5 | N2 | * | $\frac{4}{6}(58V_{ref}/64 - V_{in})$ |
| 56 | N6 | N6 | N5 | N5 | * | N1 | $\frac{4}{6}(57V_{ref}/64 - V_{in})$ |
| 55 | N6 | N6 | N5 | N5 | * | * | $\frac{4}{6}(56V_{ref}/64 - V_{in})$ |
| ⋮ | ⋮ | ⋮ | ⋮ | ⋮ | ⋮ | ⋮ | ⋮ |
| 6 | N3 | * | * | * | N2 | N1 | $\frac{4}{6}(7V_{ref}/64 - V_{in})$ |
| 5 | N3 | * | * | * | N2 | * | $\frac{4}{6}(6V_{ref}/64 - V_{in})$ |
| 4 | N3 | * | * | * | * | N1 | $\frac{4}{6}(5V_{ref}/64 - V_{in})$ |
| 3 | N3 | * | * | * | * | * | $\frac{4}{6}(4V_{ref}/64 - V_{in})$ |
| 2 | * | * | * | * | N2 | N1 | $\frac{4}{6}(3V_{ref}/64 - V_{in})$ |
| 1 | * | * | * | * | N2 | * | $\frac{4}{6}(2V_{ref}/64 - V_{in})$ |
| 0 | * | * | * | * | * | N1 | $\frac{4}{6}(V_{ref}/64 - V_{in})$ |

* DENOTES N0

A/D CONVERTER

BACKGROUND OF THE INVENTION

1. Field of the Invention

The present invention relates to A/D converters for converting analogue signals into digital signals, and more particularly, to a parallel comparison type A/D converter providing a digital signal by bilevel-processing (thresholding) parallelly an analogue signal with a plurality of reference potentials.

2. Description of the Background Art

By virtue of easiness in removing noise, processing signals, designing circuits and supporting high level functions, digital signal processing is carried out widely not only in the technical field of computers, but also in fields in which signal processing was carried out analoguely in the past. Digital signal processing requires conversion of analogue signals into digital signals. To this end, A/D converters are used.

FIG. 1 is a schematic diagram of a structure of a conventional A/D converter. The A/D converter of FIG. 1 converts an input analogue signal into a 4-bit digital signal. Such an A/D converter is disclosed in an article entitled "A 10-bit 5-M sample/s CMOS Two-step Flash ADC" by J. Doernberg et al. in JSSC Vol. 24, No. 2, pp. 241-249, issued April, 1989.

Referring to FIG. 1, a conventional A/D converter comprises a resistor voltage divider 1 for generating a plurality of reference potentials, a comparator group 2 for bilevel-processing an input analogue voltage signal received from a node 6 by the reference potentials from resistor voltage divider 1 and providing this processing result parallelly, and an encoder 3 for encoding the output signal from comparator group 2 to provide a digital signal.

Resistor voltage divider 1 comprises a plurality of resistors R0 - R3 (four resistors in FIG. 1) connected in series between a reference voltage applying terminal 4 supplied with a first reference potential and a reference voltage applying terminal 5 supplied with a second reference voltage. Each of resistors R0-R3 have the same resistance r. The interconnection nodes of reference voltage applying terminals 4, 5 and resistors R0-R3 are coupled to the inputs of comparator group 2 as reference voltage output terminals N0-N4.

The first reference voltage applying terminal 4 receives a first reference voltage $V_{ref}$. The second reference voltage applying terminal 5 receives a second reference voltage 0V. 0, $V_{ref}/4$, $V_{ref}/2$, $3.V_{ref}/4$ and $V_{ref}$ are provided as reference voltages from output nodes N0-N4

Comparator group 2 comprises a plurality of comparators each receiving a predetermined set of reference voltages applied from reference voltage output terminals N0-N4 and an analogue voltage signal applied to terminal 6 receiving a to-be-compared voltage for bilevel-processing. Because the resolution of the A/D converter of FIG. 1 is 4 bits (the output of encoder 3 is of 4 bits), the number of comparators included in comparator group 2 is $2^4 - 1 = 15$.

Encoder 3 comprises an AND gate array 3a detecting the boundary between "0" and "1" of the data of 15 bits provided from comparator group 2, and a ROM 3b providing a digital value by encoding the 15-bit data into a 4-bit data using the output from AND gate array 3a as an address signal.

FIG. 2 shows a specific structure of AND gate array 3a and ROM 3b. Referring to FIG. 2, AND gate array 3a comprises sixteen NAND gates G10-G115 that is one more in number than the comparators (15; #1-#15) in comparator group 2. NAND gate G1j (j=1-14) has one input coupled to receive the output of comparator #j−1, and the other input coupled to receive the output of inverter G2j. Inverter G2j receives the output of comparator #j. NAND gate G10 has one input receiving supply potential $V_{cc}$ and the other input receiving the output of inverter G20. NAND gate G115 has one input receiving the output of comparator #14 and the other input receiving the supply potential $V_{cc}$.

AND gate array 3a further comprises an inverter G3i receiving the output of NAND gate Gli (i =0-14). NAND gate Gli and inverter G3i form an AND gate.

The gate circuit constituted by NAND gate G1j and inverter G2j provide a complementary signal to an output of the AND gate. The output of NAND gate G10 is applied to ROM 3b via inverter G30. The output of NAND gate G115 is applied directly to ROM 3b.

ROM 3b compresses the 16-bit data (assuming that complementary data is 1 bit) from AND gate array 3a into data of 4 bits B3-B0. ROM 3b comprises 16 rows of transistors provided corresponding to the 16 NAND gates. Each transistor row comprises a P channel MOS transistor QP and an N channel MOS transistor QN. Transistor QP transmits an "H" signal of supplied potential $V_{cc}$ level to a related data line (B0-B3). Transistor QN transmits "L" signal of ground potential $V_{ss}$ level to a related data line (B0-B3). The gate of transistor QP receives the output of a corresponding NAND gate of AND gate array 3a. The gate of transistor QN receives the output of a corresponding inverter of AND gate array 3a. Each transistor row comprises PMOS transistors QP and NMOS transistors QN arranged to represent in binary notation the reference number j (decimal) of a corresponding NAND gate G1j.

For example, when an output of comparators #14 - #0 is (00...0111), only the output of NAND gate G13 is L. At this condition, data (B3, B2, B1, B0) =(0011) is provided from ROM 3b. When outputs of comparators #14 #0 are all H, only the output of NAND gate G115 is L, and data of (1111) is provided from ROM b. When all the outputs of comparators #14 - #0 are L, only the output of NAND gate G10 is L, and data of (0000) is provided from ROM 3b.

FIG. 3 shows the structure of the comparators in comparator group 2. Referring to FIG. 3, the comparator comprises four coupling capacitors C0-C3 each having equal capacitance, and an inverting amplifier 11. One node of each of coupling capacitors C0-C3 is connected to input nodes 7-10 or analogue voltage applying terminal 6 via switches S0-S3, respectively. The other nodes of coupling capacitors C0-C3 are connected in common to the inverting amplifier 11. The input of inverting amplifier 11 is also connected to bias voltage applying terminal 12 via switch S4.

The comparator group 2 of FIG. 1 is provided with fifteen comparators each having a structure shown in FIG. 3. Except for the difference in voltages applied to reference voltage applying terminals 7-10, the fifteen comparators each have a similar structure.

FIG. 4 shows, in a list, the connection relation between reference voltage applying terminals 7-10 of each comparator and reference voltage output terminals N0-N4 of resistor voltage divider 1. In FIG. 4, the number of the comparator corresponds to the level of an analogue input voltage signal. For example, the input terminals 7-10 of the fourteenth comparator #13 are connected to reference voltage output nodes N3, N4, N4, and N4, respectively, of resistor voltage divider 1. Reference voltage output nodes N0-N4 are connected to input nodes 7-10 so that the output thereof is decreased by one level as the number of the comparator descends. The operation will be explained hereinbelow.

The operation of the comparator of FIG. 3 will be first explained. This comparator operates in two stages.

In the first stage, switches S0-S4 initially establish the connection states of FIG. 3. The switching of these switches are carried out in response to a clock signal from a clock signal applying means not shown. This clock signal determines the sampling rate. Switches S0-S3 connect one nodes of coupling capacitors C0-C3 to analogue voltage applying terminal 6. Switch S4 connects the input of inverting amplifier 11 to bias voltage applying terminal 12. Bias voltage applying terminal 12 is generally supplied with an appropriate voltage $V_B$ that makes inverting amplifier 11 most sensitive.

When the analogue input voltage applied to terminal 6 is $V\text{in}$, and the capacitance of coupling capacitors C0-C3 is C, charge Q expressed by:

$$Q = C \cdot (V_B - V\text{in}) \quad \ldots (1)$$

is applied to each of coupling capacitors C0-C3. In other words, charge of $4 \cdot Q$ is stored in the input terminal of inverting amplifier 11.

This operation is followed by the operation of the second stage. At the second stage, switches S0-S3 connect reference voltage applying nodes 7-10 to one node of respective coupling capacitors C0-C3 in response to a clock signal. Switch S4 is turned off.

This off state of switch S4 causes the charge of $4 \cdot Q$ stored in the input of inverting amplifier 11 at the first gate to be held also at the second stage.

Because switches S0-S4 have their connection terminal switched from analogue voltage applying terminal 6 to respective reference voltage applying nodes 7-10, the voltage in the input of inverting amplifier 11 changes in response to the applied reference voltage. If the reference voltages applied to each of reference voltage applying nodes 7-10 are V7-V10, and the voltage in the input of inverting amplifier 11 is Va, charge Q' at the input of inverting amplifier 11 is:

$$Q' = \sum_{j=7}^{10} C \cdot (Va - Vj) \quad (2)$$
$$= 4 \cdot C \cdot Va - C \cdot \sum_{j=7}^{10} Vj$$

Because switch S4 is off, $Q' = 4 \cdot Q$ is obtained according to the principle of conservation of charges to provide the following equation from equations (1) and (2):

$$4 \cdot C \cdot (V_B - V\text{in}) = 4 \cdot C \cdot Va - C \cdot \sum_{j=7}^{10} Vj \quad (3)$$

From equation (3), the following equation is obtained:

$$Va = V_B + (1/4) \sum_{j=7}^{10} Vj - V\text{in} \quad (4)$$
$$= V_B + \sum_{j=7}^{10} (Vj/4 - V\text{in})$$

The reference voltages Vj applied to comparators are different in each comparator. For example, the comparator #14 receives reference voltages Vj of Vref, Vref, Vref, and $3 \cdot Vref/4$. Hence, $$Va - V_B = 3 \cdot (Vref/4) + (3 \cdot 4) Vref - V\text{in}$$
$$= 15 \cdot Vref/16 - V\text{in}$$

is obtained for comparator #14. The output nodes N0-N4 of resistor voltage divider 1 are connected to comparator input nodes 7-10 so that the total value of the reference voltages decreases by $Vref/4$ as the number of the comparator descends by 1. Therefore, it can be understood from the table of FIG. 4 that the voltage shift $\Delta Vj$ from bias voltage $V_B$ in the input of inverting amplifier 11 is generally expressed as:

$$\Delta Vj = ((j + 1/16) \cdot Vref - V\text{in} \quad \ldots (5)$$

where j is the comparator number. This voltage shift $\Delta Vj$ from bias voltage $V_B$ is inverted and amplified by inverting amplifier 11 to be provided as the comparison result. The comparison results from comparator group 2 are applied to encoder 3.

Now, a case is considered where analogue input voltage $V\text{in}$ is between $2 \cdot Vref/16$ and $3 \cdot Vref/16$. At this time, inverting amplifiers 11 of comparators #2–#14 all provide 0, and inverting amplifiers 11 of comparators #1 and #0 provide 1. Each NAND gate of AND gate array receives the outputs of the adjacent comparators. Therefore, only the output of NAND gate G12 that receives the outputs of inverting amplifiers 11 of comparators #2 and #1 is 0. The comparator which provides a changing output in the output series in the comparator group can be detected, and the level of analogue input voltage $V\text{in}$ is detected to be at a level between the levels of comparators #1 and #2. Therefore, the output from AND gate array 3a (inverters G30-G31 and gate G115) is $<15;0> = (00 \ldots 0100)$, to provide a 4-bit data of (0010) from ROM 3b. Thus, a 4-bit digital signal for analogue input voltage $V\text{in}$ in 16 division levels is obtained.

The A/D converter of FIGS. 1 through 3 has a total resolution of four bits by generating four levels with resistor voltage divider 1 (resolution: equivalent to 2 bits) and further generating four levels with coupling capacitors C0-C3 (resolution: equivalent to 2 bits).

In accordance with the above manner, a reference voltage of m bits is generated by a resistor voltage divider ($2^m$ levels) and further voltage-dividing of n bits is carried out by coupling capacitors ($2^2$ levels), whereby the number of distinguishable levels of the A/D converter is $2^{m+n}$ to result in a resolution of (m + n) bits for the A/D converter. In this case, $2^m$ resistors are necessary in the resistor voltage divider circuit. The total number of coupling capacitors required is $2^n$ per comparator.

The implementation of an A/D converter having a resolution of (m + n) bits according to the conventional method requires $2^m$ resistors, and $2^n$ coupling capacitors per comparator. This means that there is a problem of exponential increase in the number of necessary elements in proportion to the increase of bits of the resolution of the A/D converter.

It was not possible to constitute an A/D converter of high resolution with a small number of elements, resulting in increase in size and cost of the A/D converter.

SUMMARY OF THE INVENTION

In view of the foregoing, an object of the present invention is to provide an A/D converter having the number of elements greatly reduced.

A first A/D converter according to an aspect of the present invention includes a resistor network circuit provided between a first reference voltage supplying node and a second reference voltage supplying node. The resistor network circuit generates a voltage signal $\frac{1}{2}^n$ times (n is a natural number) the difference between the first reference voltage and the second reference voltage using the resistor interconnection nodes as the reference voltage output nodes.

The first A/D converter further includes a comparator group constituted by a plurality of comparators each receiving the output voltages of a predetermined set of reference voltage output nodes from the resistor network circuit for comparison with an analogue input voltage.

A second A/D converter according to another aspect of the present invention includes a first resistor network circuit provided between a first reference voltage supplying node and a first internal node. Each resistor connection of the first resistor network circuit divides into equal potentials the difference between the first reference voltage and the voltage of the first node.

The second A/D converter further includes a second resistor network circuit provided between the first internal node and a second reference voltage supplying node. The second resistor network circuit generates voltage signals $\frac{1}{2}^n$ times (n is a natural number) the difference between the first internal node voltage and the second reference voltage using each resistor connection node as the output node.

The second A/D converter further includes a comparator group having a plurality of comparators each receiving the output voltages of a predetermined set of the output nodes of the first and second resistor network circuits for comparison with an externally applied analogue voltage signal.

The resistor network circuit in the first A/D converter and the second resistor network circuit of the second A/D converter each include a R/2R resistor network.

Each of the comparators in the first and the second A/D converters include a plurality of coupling capacitors selectively receiving supplied reference voltages and the analogue input voltage signal.

The resistor network circuit of the first A/D converter generates a binary-weighted voltage as the reference voltage. Reference voltages from the resistor network circuit are transmitted to a number of coupling capacitors. This number of coupling capacitors is equal to the number of resolution bits in each comparator of the comparator group.

Therefore, the number of resistors in the resistor network circuit increases only in linear manner with the increase of the resolution to reduce the number of component elements.

According to the second A/D converter, the voltage attenuation factor can be significantly reduced in the input of inverting amplifiers in the comparator group by the first resistor network circuit to improve the sensitivity of the A/D converter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a table showing the connection between the output nodes of the resistor voltage divider and the input nodes of the comparators of FIGS. 1 and 2, and the voltage shift of the input of the inverting amplifier in each connection.

FIG. 7 is a table indicating the connection between each nodes of the resistor voltage divider and the comparators of FIG. 5 and 6, and the voltage shift in the input nodes of the inverting amplifiers of the comparators.

FIG. 10 is a table showing the connection of each nodes of the resistor voltage divider and the comparators of FIGS. 8 and 9, and the voltage shift in the input nodes of the inverting amplifiers of the comparators.

DESCRIPTION OF THE PREFERRED EMBODIMENTS

Figure 5:
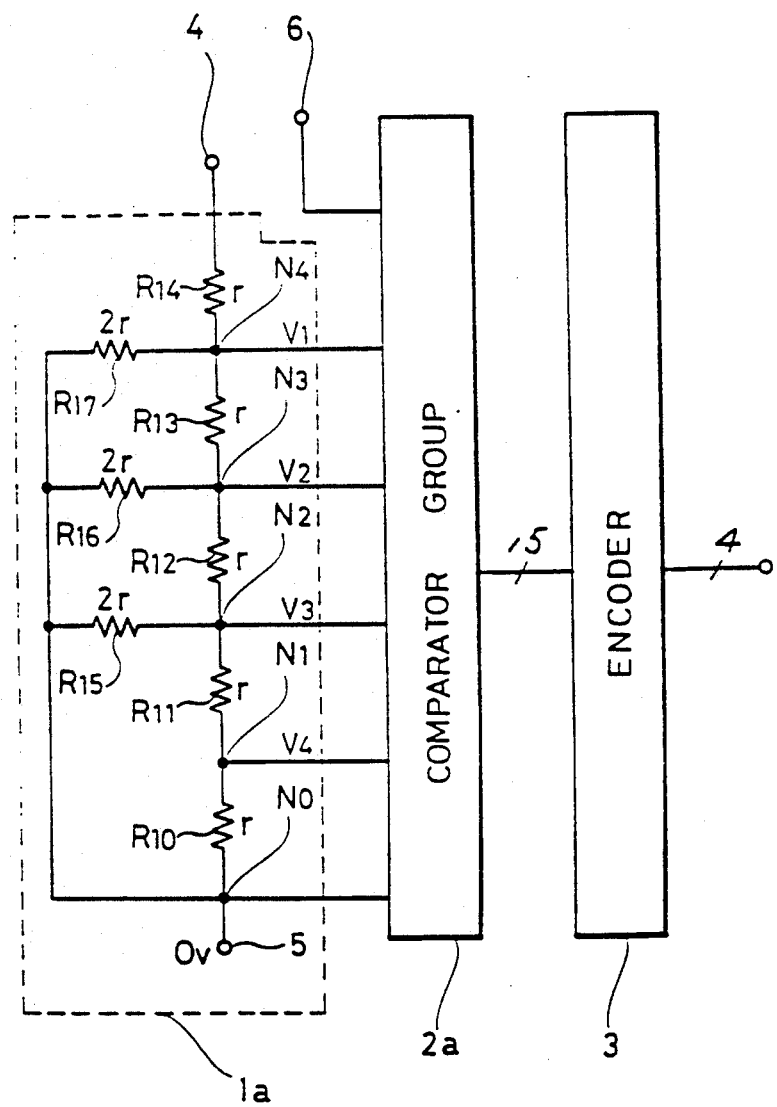
FIG. 5 shows a structure of an A/D converter according to an embodiment of the present invention.

FIG. 5 shows a structure of an A/D converter according to an embodiment of the present invention. The A/D converter of FIG. 5 has a resolution of four bits.

Referring to FIG. 5, the A/D converter comprises a resistor voltage divider 1a for generating a reference potential, a comparator group 2a receiving a reference potential from resistor voltage divider 1a for comparing with an analogue input voltage from an analogue voltage supplying terminal 6, and an encoder 3 for converting the output of comparator group 2a into a 4-bit digital signal.

Resistor voltage divider 1a comprises resistors R14–R10 connected in series between a first reference voltage applying terminal 4 and a second reference voltage applying terminal 5. The resistors R10-R14 take an identical resistance value of r. One end of resistor R10 is connected to the second reference voltage applying terminal 5. The other end of resistor R14 is connected to the first reference voltage applying terminal 4.

Resistor voltage divider 1a further comprises resistors R15–R17 respectively connected between all the resistor interconnection nodes N2 to N4 excluding resistor interconnection node N1 that is closest to the second reference voltage applying terminal 5 and the second reference voltage applying terminal 5. The resistance of each of resistors R15–R17 is 2r. Resistor R15 is connected between resistor interconnection node N2 and node N0 (the second reference voltage applying terminal 5). Resistor R16 is connected between resistor interconnection node N3 and node N0. Resistor R17 is connected between resistor interconnection node N4 and node N0.

Referring to resistor voltage divider 1a of FIG. 5, the resistance between nodes N1 and N0, nodes N2 and N0, nodes N3 and N0, and nodes N4 and N0 is respectively r. Now, the case is considered where reference voltage Vref is applied to the first reference voltage applying terminal 4, and where the second reference voltage applying terminal 5 is grounded in the resistor voltage divider 1a of FIG. 5.

Voltages V4 to V1 of nodes N1 to N4 is:

$$Vj = (\tfrac{1}{2}^{5-j}) \cdot Vref \ldots \quad (6)$$

where $j = 1$ to $4$

That is to say, a voltage ($\tfrac{1}{2}^n$) times the difference of the voltages applied to first and second reference voltage applying terminals 4 and 5 is provided from each of resistor interconnection nodes N1 to N4, where n is a natural number.

Comparator group 2a compares an analogue input voltage provided from input terminal 6 with a reference voltage of each node output from resistor voltage divider 1a to detect the level of the analogue input voltage.

Figure 6:
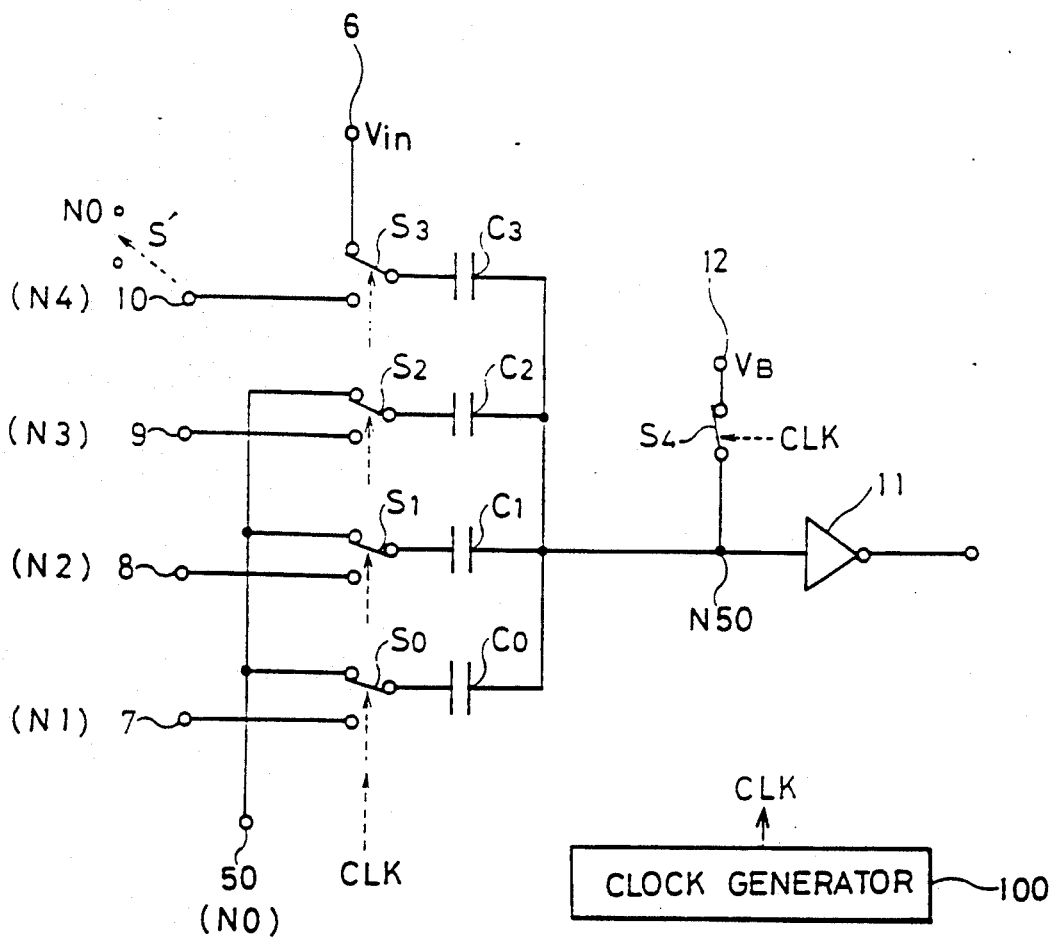
FIG. 6 shows a structure of a comparator employed in the A/D converter of FIG. 5.

FIG. 6 shows a structure of comparator group 2a of FIG. 5. The comparator of FIG. 6 has a structure similar to that of the comparator of FIG. 3, except that the connected destinations of switches S0 to S3 differ. More specifically, switch S0 selectively connects the second reference voltage applying terminal 5 (node 50) and input node 7 to one node of coupling capacitor C0. Switch S1 connects either of the second reference voltage applying terminal 5 (node 50) or input node 8 to one node of coupling capacitor C1. Switch S2 selectively connects the second reference voltage applying terminal 5 (node 50) and input node 9 to one node of coupling capacitor C2. Switch S3 connects either of analogue voltage applying terminal 6 or input node 10 to one node of coupling capacitor C3.

Comparator group 2a comprises fifteen of the comparators of FIG. 6. The connection between input nodes 7 to 10 of each comparator and the output nodes N0 to N4 of resistor voltage divider 1a are shown in the table of FIG. 7. Referring to the table of FIG. 7, the number of a comparator ascends as the detection level of the analogue input voltage increases. The asterisk (*) in the table of FIG. 7 denotes connection to the second reference voltage applying terminal 5, i.e. node N0.

It is appreciated from the table that the level of the reference voltage applied to the input node of a comparator (the sum of the voltage provided from resistor voltage divider 1a) is reduced by 1 in accordance with the comparator taking one greater number. Resistor interconnection nodes N4 or N0, N3 or N0, N2 or N0, N1 or N0 of resistor voltage divider 1a is connected to input nodes 10, 9, 8, and 7, respectively. Indicating the connection to resistor interconnection node N0 as "0" and the connection to the corresponding resistor interconnection node as "1", the connection shown in FIG. 7 between a comparator and the resistor voltage divider can be obtained by a binary representation of the value adding 1 to the number of the comparator. The operation thereof will be explained hereinbelow.

Figure 3:
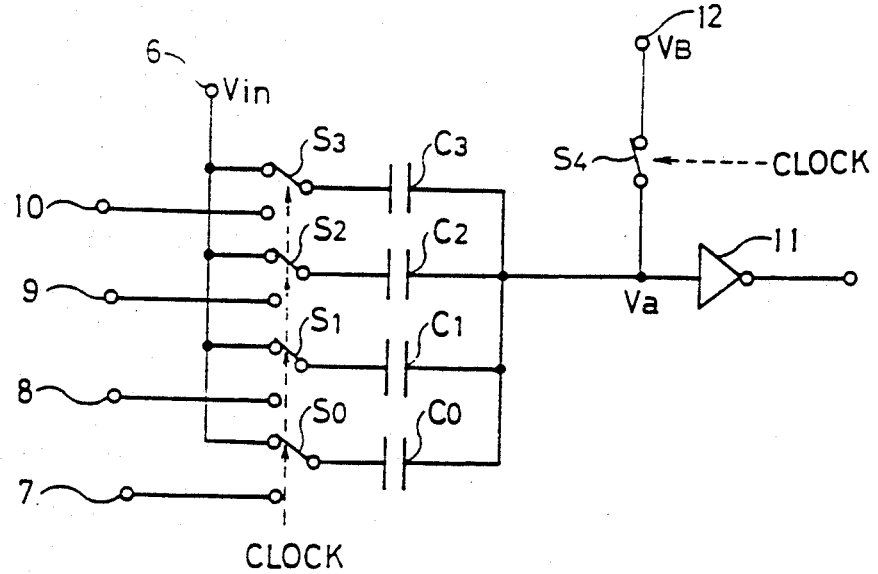
FIG. 3 shows an example of a specific structure of a comparator in the comparator group of FIG. 1.
Figure 2:
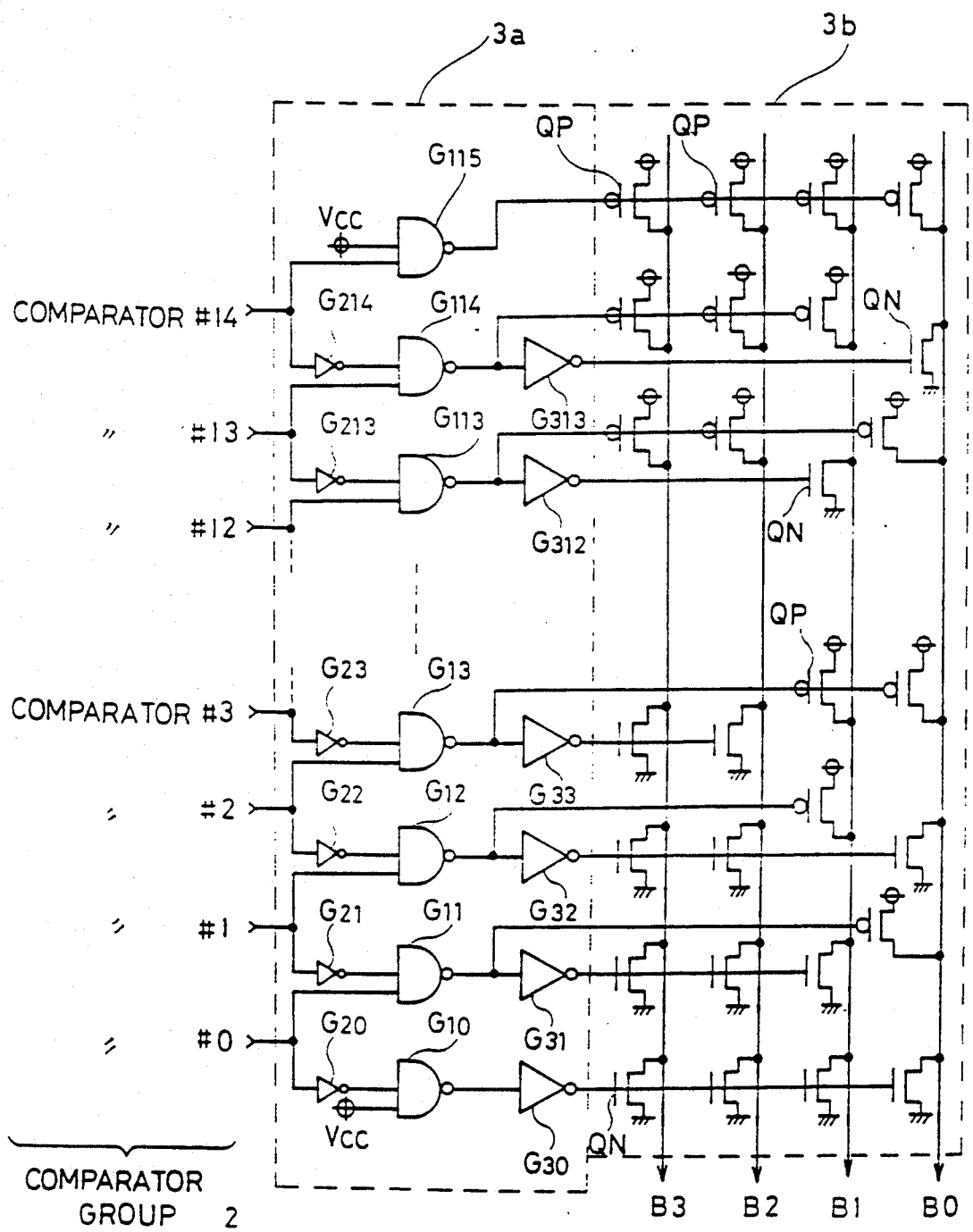
FIG. 2 shows an example of a specific structure of an encoder of FIG. 1.

The comparator of FIG. 6 operates in two stages in response to a clock signal CLK from an externally provided clock generator 100, similar to a conventional comparator of FIG. 3.

At the first stage, in response to clock signal CLK, switches S0 to S2 are connected to reference voltage applying terminal 5 (node 50), switch S3 is connected to analogue voltage applying terminal 6, and switch S4 is rendered conductive. The conduction of switch S4 causes bias voltage $V_B$ to be applied to input node N50 of inverting amplifier 11, and analogue input voltage Vin to be applied to one end (input node) of coupling capacitor C3 via terminal 6. One node of respective coupling capacitors C0–C2 receives the voltage (in this case ground voltage) applied to the second reference voltage applying terminal 5 (node 50). As a result, charge Q expressed by the following equation:

$$Q = C \cdot (V_B - V\text{in}) + 3 \cdot C \cdot V_B \ldots \quad (7)$$

is stored in input node N 50 of inverting amplifier 11, where C is the capacitance of coupling capacitors C0 to C3.

The level of clock signal CLK changes, whereby the operation of the second stage is carried out. At this second stage, switches S0 to S3 are connected to the corresponding input nodes 7 to 10, and switch S4 is open. Charge Q in node N50 is maintained, but the voltage of node N50 changes according to the voltages applied to input nodes 7 to 10. When the voltage at input node N50 of inverting amplifier 11 in the second stage is Va, charge Q' in node N50 is expressed by the following equation:

$$Q' = \sum_{j=7}^{10} C \cdot (Va - Vj) \quad (8)$$

Because $Q = Q'$ from the principle of conservation of charges, equations (7) and (8) gives:

$$C \cdot (V_B - V\text{in}) + 3 \cdot C \cdot V_B = \sum_{j=7}^{10} C \cdot (Va - Vj) \quad (9)$$

The following expression is obtained by modifying equation (9):

$$Va = V_B + \left( \sum_{j=7}^{10} Vj - V\text{in} \right)/4 \quad (10)$$

Reference voltage Vj is the voltage applied to input nodes 7 to 10, and differs with each comparator. The voltage difference $Va - V_B$ at input node N50 of inverting amplifier 11 for each comparator, corresponding to the connection between each of input nodes 7 to 10 and resistor interconnection nodes N0 to N4 of resistor voltage divider 1a are shown in the table of FIG. 7. It is appreciated from the table of FIG. 7 that the voltage shift $\Delta Vk = Va - V_B$ of input node N50 of inverting amplifier 11 in a comparator #k is generally expressed as:

$$\Delta Vk = \{((k+1)/16) \cdot Vref - Vin\} \cdot (\tfrac{1}{4}) \ldots \quad (11)$$

The voltage shift $\Delta Vk$ from bias voltage $V_B$ is amplified by inverting amplifier 11 in each comparator to be bilevel-processed (sign determination), and then applied to encoder 3. In a conventional manner, encoder 3 converts the output voltage group from comparator group 2a into a 4-bit digital signal.

By forming the A/D converter according to the above mentioned structure, the number of resistors having a resistance of r is (n+1), and the number of resistors having a resistance of 2·r is (n−1) in the resister voltage divider with an A/D converter of a resolution of n bits. Even if one resistor having the resistance of 2·r is estimated as two resistors having the resistance of r, the number of resistors required for an A/D converter of n bits is (3n−1). Therefore, the number of resistors increase only linearly when the resolution (n) is enhanced.

The number of capacitors required in a comparator group 2a is n per comparator, whereby the number thereof increases only linearly in accordance with enhancement in resolution. It is therefore possible to implement a large scaled and high precision A/D converter with less number of elements.

The A/D converter of FIG. 5 comprises a structure in which the connection between input nodes 50, 7 to 10 of FIG. 6 and reference voltage output nodes (resistor interconnection nodes) N0 to N4 of resistor voltage divider 1a is modified in a hardware manner for each comparator. A similar A/D converter can be implemented with the following method. As shown in the parenthesis of FIG. 6, reference voltage applying terminals (input nodes) 7 to 9 of the fifteen comparators are connected to resistor interconnection nodes (reference voltage output nodes) N1 to N3 all in the same manner, and input node 50 is connected to node N0. At the second stage, only the switch corresponding to each respective input node (corresponding to * of FIG. 7) that should be connected to resistor interconnection node N0 is connected to the second reference voltage input node 50 fixedly without switching operation. In this fixing scheme, a structure may be employed where a control signal of a fixed level is supplied instead of clock signal CLK.

It is necessary to connect analogue input voltage $Vin$ to either of reference voltage output nodes N4 or N0 for reference voltage input node 10. Therefore, a structure may be implemented where an additional switch S' connectable with both nodes of N4 and N0 is provided, which is connected to one terminal of switch S3 in response to clock signal CLK. The input connection wiring for the comparator can all take the same arrangement with the immediately above described structure.

It is also possible to implement a structure where switch S' connected to reference voltage output node (resistor interconnection node) N0 at the second stage is short circuited to be connected constantly to the second reference voltage input node 50 (reference voltage output node N0). In this case, wiring is formed to allow connection of nodes N4 and N0 with input node 10, whereby one reference voltage output node is selected to be connected to one input portion of switch S3 by the wiring. The connection relation of the input nodes 7–10 of all comparators may be identical. It is possible to establish the connected relation between input nodes 7–10 and reference voltage output nodes N0–N4 as in FIG. 7 by the wiring arrangement of the switch portion.

Where the comparator of FIG. 6 is employed, analogue input voltage $Vin$ is applied at the first stage only to one of the n coupling capacitors in the A/D converter of n bits. The voltage shift $\Delta V$ from bias voltage $V_B$ in input node N50 of inverting amplifier 11 is:

$$\Delta Vk = (1/n)[\{(k+1) \cdot Vref/2^n\} - Vin]$$

where $k = 0$ to $2^{n-2}$... (12)

per one comparator (number k) in an A/D converter of n-bit resolution. This is 1/n of the voltage change $\{((k+1)^n) \cdot Vref - Vin\}$ required for one comparator. This means that there will be some cases where the analogue input voltage cannot be converted accurately into a digital signal. A method of relaxing this voltage shift reduction will be explained hereinafter.

Figure 8:
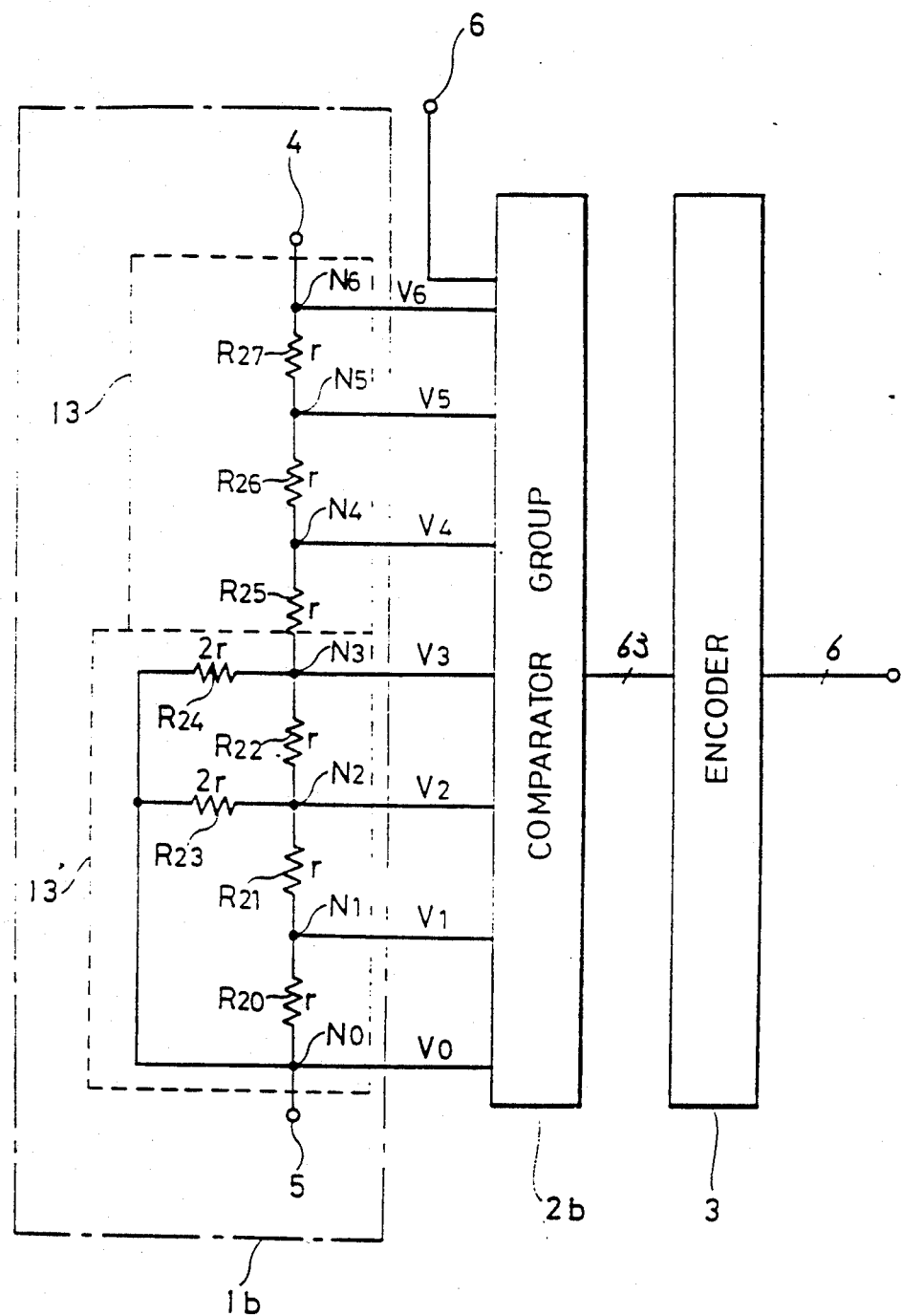
FIG. 8 shows a structure of an A/D converter according to another embodiment of the present invention.

FIG. 8 is a diagram showing a structure of an A/D converter according to another embodiment of the present invention. The A/D converter of FIG. 8 has a resolution of 6 bits.

Referring to FIG. 8, resistor voltage divider 1b comprises a resistor string 13 corresponding to two bits (4 levels) for dividing the voltage between the first reference voltage applying terminal 4 and internal node N3 into equal potentials, and an R/2R resistor network 13' of 2 bits for generating a binary-weighted voltage using the voltage difference between node N3 and the second reference voltage applying terminal N0 (terminal 5). Resistor string 13 comprises resistors R5–R7 connected in series between the first-reference voltage applying terminal 4 and internal node N3. The resistance of resistors R5 to R7 is r. The other end of resistor R7 is connected to the first reference voltage applying terminal 4 via node N6. One end of resister R5 is connected to node N3.

R/2R resistor network 13' comprises resistors R20 to R22 connected in series between node N0 and node N3, and resistors R23 and R24 connected between respective nodes of N2 and N3, and node N0. The resistance of resistors R20 to R22 is r. The resistance of resistors R23 and R24 is 2r. In the structure of resistor voltage divider 1b of FIG. 8, the combined impedance associated with node N3 of R/2R network 13' is r. Voltages V0 to V6 of reference 1b is:

$$V6 = Vref$$

$$V5 = 3 \cdot Vref/4$$

$$V4 = 2 \cdot Vref/4$$

$$V3 = Vref/4$$

$$V2 = Vref/8$$

$$V1 = Vref/16$$

$$V0 = 0 \ldots \quad (13)$$

where the first reference voltage applying terminal 4 receives voltage $Vref$, and the second reference voltage applying terminal 5 is grounded.

Figure 9:
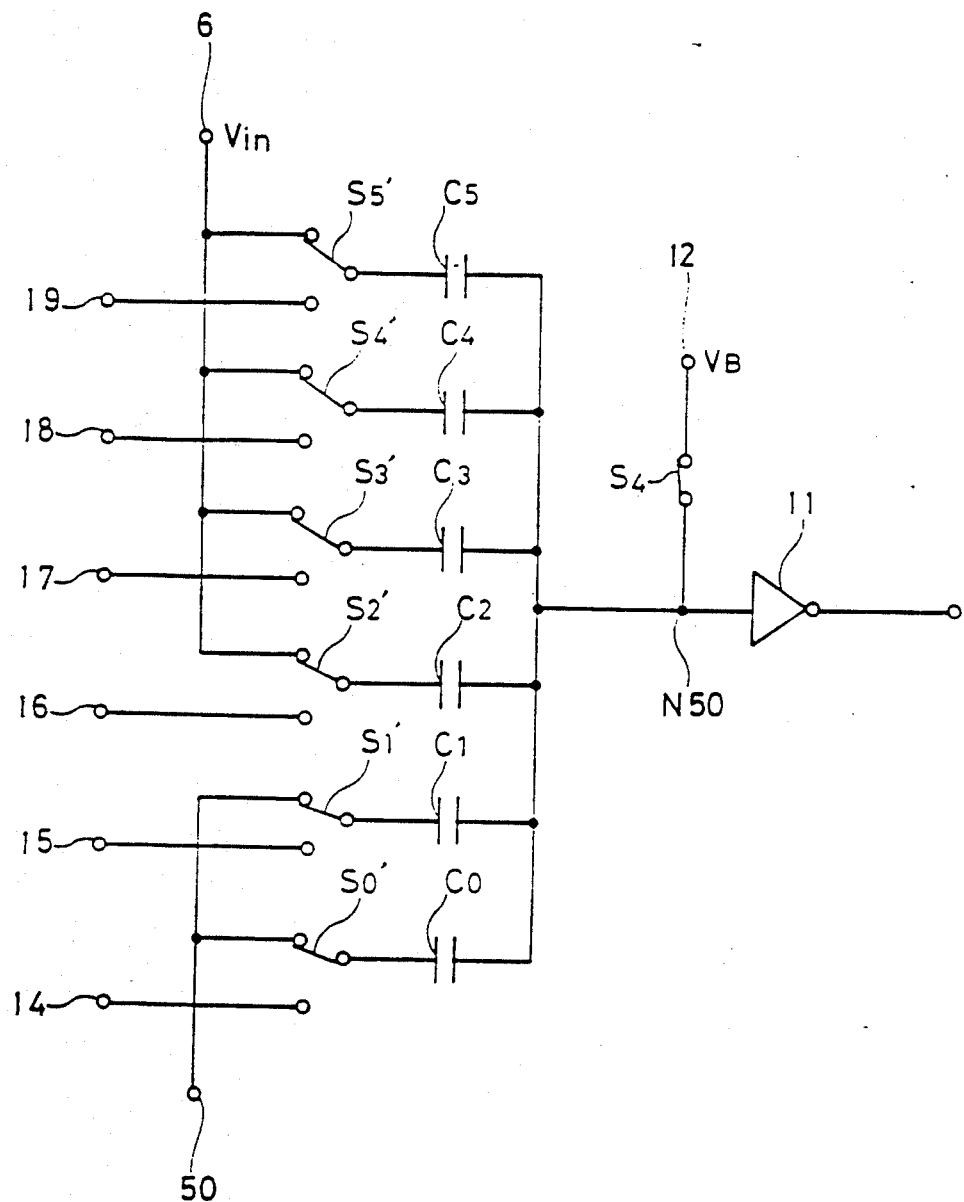
FIG. 9 shows a structure of a comparator employed in the A/D converter of FIG. 8.

FIG. 9 is a structure of a comparator employed in the A/D converter of FIG. 8. The comparator of FIG. 9 comprises six coupling capacitors C0 to C5 and six input switches S0' to S5'. Coupling capacitors C0 to C5 all have capacitance C.

Switch S0' connects either input nodes 50 or 14 to the input node of coupling capacitor C0. Switch S1' connects either of input nodes 15 or 50 to the input node of coupling capacitor C1. Switch S2' connects either input node 16 or analogue voltage applying terminal 6 to the input node of coupling capacitor C2. Switch S3, connects either of input node 17 or analogue voltage applying terminal 6 to the input node of coupling capacitor C3. Switch S4' connects either of input node 18 or analogue voltage applying terminal 6 to the input node of coupling capacitor C4. Switch S5' connects either of input node 19 or analogue input voltage applying terminal 6 to the input node of coupling capacitor C5. The output nodes of coupling capacitors C0 to C5 are connected to the input of inverting amplifier 11 via node N50. Input node N50 of inverting amplifier 11 is selectively supplied with bias voltage $V_B$ provided from terminal 12 via switch S4.

Input nodes 14 and 15 receive the output reference voltage from R/2R resistor network 13'. Input nodes 16 to 19 receive the reference voltage from resistor string 13 or the second reference voltage. The comparator group 2b of FIG. 8 comprises 63 ($2^6-1=63$) of the comparators of FIG. 9. The connection relation between reference voltage input terminals 14 to 19 of the comparators of FIG. 9 and the reference voltage output terminals N0 to N6 of resistor voltage divider 1b is summarized in FIG. 10.

Referring to FIG. 10, the input nodes of the comparators are divided into two groups of input nodes 14 and 15. and input nodes 16 to 19. Any of reference voltage output nodes N0 to N2 of resistor voltage divider 1b is connected to input nodes 14 and 15. Any of reference voltage output nodes N3 to N6 and N0 of the resistor voltage divider is connected to input nodes 16 to 19.

Input nodes 14 and 15 receive a reference voltage (the sum of input voltage) having the level decreased by 1 as the number of the comparator descends. Input nodes 16 to 19 receive a reference voltage having the level decreased by 1 for every 4 comparators with their number in descending order. The operation thereof will be explained hereinafter.

The operation of the comparator of FIG. 9 will be explained. The comparator of FIG. 9 also operates in two stages. At the first stage, switch S4 is conductive, switches S0' and S1' are connected to the second reference voltage input terminal 50, and switches S2' to S5' are connected to analogue input voltage applying terminal 6. Charge Q stored in the input node N50 of inverting amplifier 11 at the first stage is:

$$Q = 4 \cdot C \cdot (V_B - V_{in}) + 2 \cdot C \cdot V_B \ldots \quad (14)$$

At the second stage, switch S4 is OFF, and switches S0' to S5' are connected to the corresponding reference voltage applying input nodes 14 to 19. If the voltages applied to reference voltage input nodes 14 to 19 are respectively V14 to V19, charge Q' stored in input node N50 of inverting amplifier 11 at the second stage is:

$$Q' = 6 \cdot C \cdot \sum_{j=14}^{19} (V_a - V_j) \quad (15)$$

where Va is the voltage of input node N50. Since Q =Q' according to the principle of conservation of charges, the following equation is obtained from equations (14) and (15).

$$V_a = V_B + (4/6)\left( \sum_{j=14}^{19} (V_j/4) - V_{in} \right) \quad (16)$$

Voltage shift $\Delta V$ ($=V_a-V_B$) from bias voltage $V_B$ of inverting amplifier 11 at the second stage differs with each comparator. Voltage shift $\Delta V$ in each comparator is shown in FIG. 10. It is appreciated from the table of FIG. 10 that voltage shift $\Delta V_k$ from bias voltage $V_B$ of input node N50 of inverting-amplifier 11 of each comparator is:

$$\Delta V_k = (4/6)\{((k+1)/64) \cdot V_{ref} - V_{in}\} \ldots \quad (17)$$

where k indicates the number of the comparator. From equation (17), a voltage shift $\Delta V_k$ is obtained that is 4/6 times the originally necessary voltage shift $\{(k+1)/64) \cdot V_{ref} - V_{in}\}$. A voltage shift four times that of the comparator of FIG. 6 can be obtained.

The A/D converter of FIGS. 8 and 9 implement a resolution of total of 6 bits employing a string resistor network 13 of 2 bits (4 levels), coupling capacitors C2 to C5 that voltage-divides a further 2 bits of the levels of string resistor network 13, and a pair of R/2R resistor network and coupling capacitor (C0, C1) of two bits. The A/D converter having a resolution of 6 bits is not limited to the structure shown in FIGS. 8 and 9, and may be implemented by various modifications.

Figure 11:
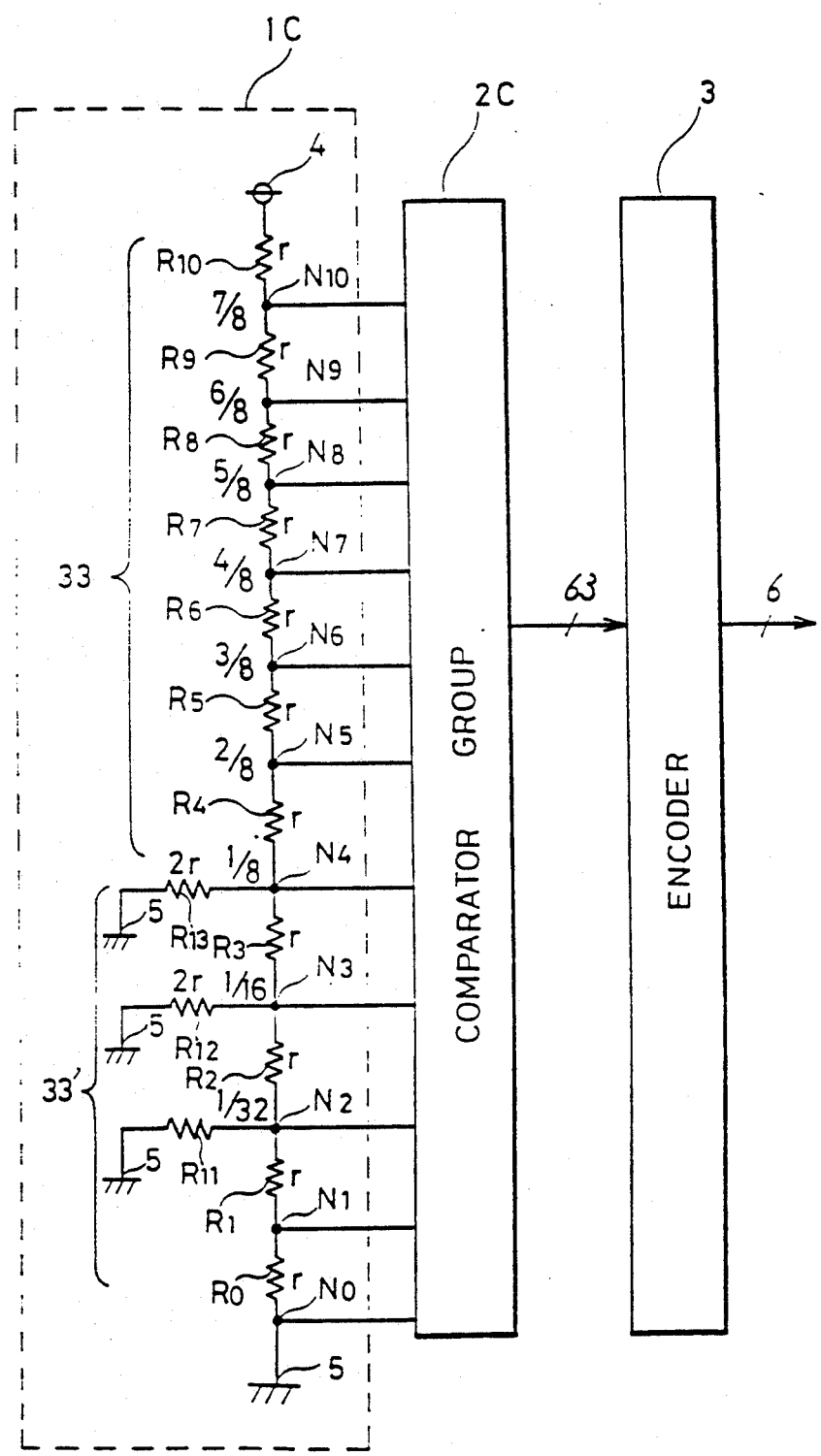
FIG. 11 shows a structure of an A/D converter according to a further embodiment of the present invention.

FIG. 11 is a diagram showing the structure of a modification of an A/D converter having a resolution of 6 bits. The A/D converter of FIG. 11 comprises a resistor string 33 formed of resistors R4 to R10 connected in series between a first reference voltage-applying terminal 4 and node N4, and an R/2R resistor network 33' provided between node N4 and a second reference voltage applying terminal 5. Each resistance of resistors R4 to R10 is r. Therefore, a reference voltage having the first reference voltage $V_{ref}$ multiplied by 1/8, 2/8, 3/8, 4/8, 5/8, 6/8, and 7/8 are provided from each of nodes N4 to N10 of resistor string 33 because the combined impedance associated with node N4 is r.

R/2R resistor network 33' comprises resistors R0 to R3 connected in series between nodes N0 and N4, and resistors R11, R12 and R13 connected between nodes N2 to N4 and the second reference voltage applying terminal 5. The resistance of resistors R0 to R3 is r. The resistance of resistors R11 to R13 is 2r. Reference voltages having the voltage difference between reference voltage applying terminals 4 and 5 multiplied by 1/64, 1/32, and 1/16 are provided from respective nodes N1 to N3.

Figure 12:
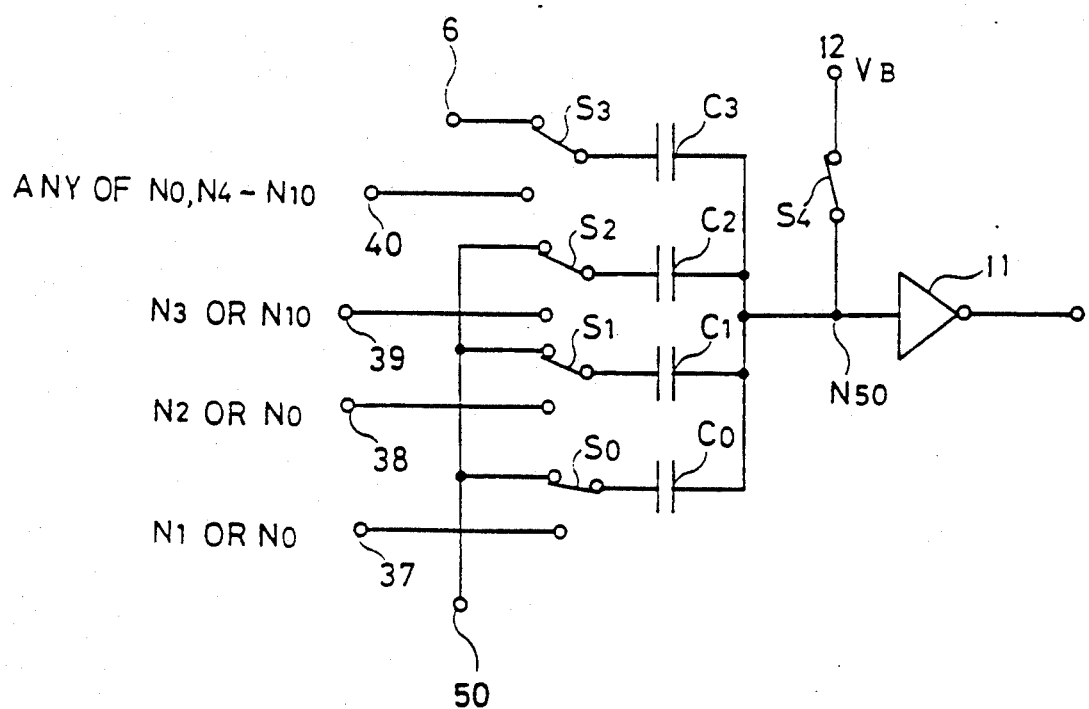
FIG. 12 shows a structure of a comparator employed in the A/D converter of FIG. 7.

FIG. 12 is a structure of a comparator employed in the A/D converter of FIG. 11. The comparator of FIG. 12 comprises four coupling capacitors C0 to C3, four switches S0 to S3, and a switch S4 for applying bias voltage $V_B$ to input node N50 of inverting amplifier 11. Switch S0 connects either the second reference voltage input node 50 or reference voltage input node 37 to the input node of coupling capacitor C0. Switch S1 connects either the second reference voltage input node 50 or reference voltage input node 38 to the input node of coupling capacitor C1. Switch S2 connects either input node 50 or input node 39 to the input node of coupling capacitor C2. Switch S3 connects either analogue input voltage applying terminal 6 or input node 40 to the input node of coupling capacitor C3. Switch S4 selectively transmits bias voltage $V_B$ applied via terminal 12 to the input node N50 of inverting amplifier 11.

Reference voltage output nodes N1 or N0, N2 or N0, N3 or N10 are connected to input nodes 37, 38, and 39, respectively. Any of reference voltage output nodes N0, N4 to N10 are connected to input node 40. Comparator group 2c comprises sixty-three of the comparators of FIG. 12. When reference voltage output node N10 is connected to input node 40 in this connection configuration, output nodes N0 to N3 are connected to input nodes 37 to 39 so that the levels of the reference voltage are reduced by one sequentially. The connection relation with respect to input nodes 37 to 39 are repeated for each output node connected to input node 40. The maximum reference voltage combination is N10, N3, N2 and N1. The minimum reference voltage combination is N0, N0, N0, and N1. Thus, the resistor string has a resolution of 3 bits, i.e. 8 levels, and the pair of R/2R resistor network 33' and coupling capacitors C0 to C2 has a resolution of 3 bits, i.e. 8 levels, to implement an A/D converter having a resolution of a total of 6 bits (64 levels).

When a resistor string contributing to the resolution of l bits, a coupling capacitor for voltage-dividing a resolution level of the resistor string into m bits, and a pair of R/2R resistor network and coupling capacitor contributing to the resolution of n bits (refer to FIG. 5) are used to carry out A/D conversion of a total of (l+m n) bits:

the number of resistors required for the resistor string is $2l-1$, the number of resistors having a resistance of r required for the R/2R resistor network is $n+1$, the number of resistors having a resistance of 2r required for the R/2R resistor network is $n-1$, the number of coupling capacitors connected to the reference voltage output nodes of the resistor string is $2^m$, and the number of coupling capacitors connected to the reference voltage output nodes of the R/2R resistor network is n.

Figure 1:
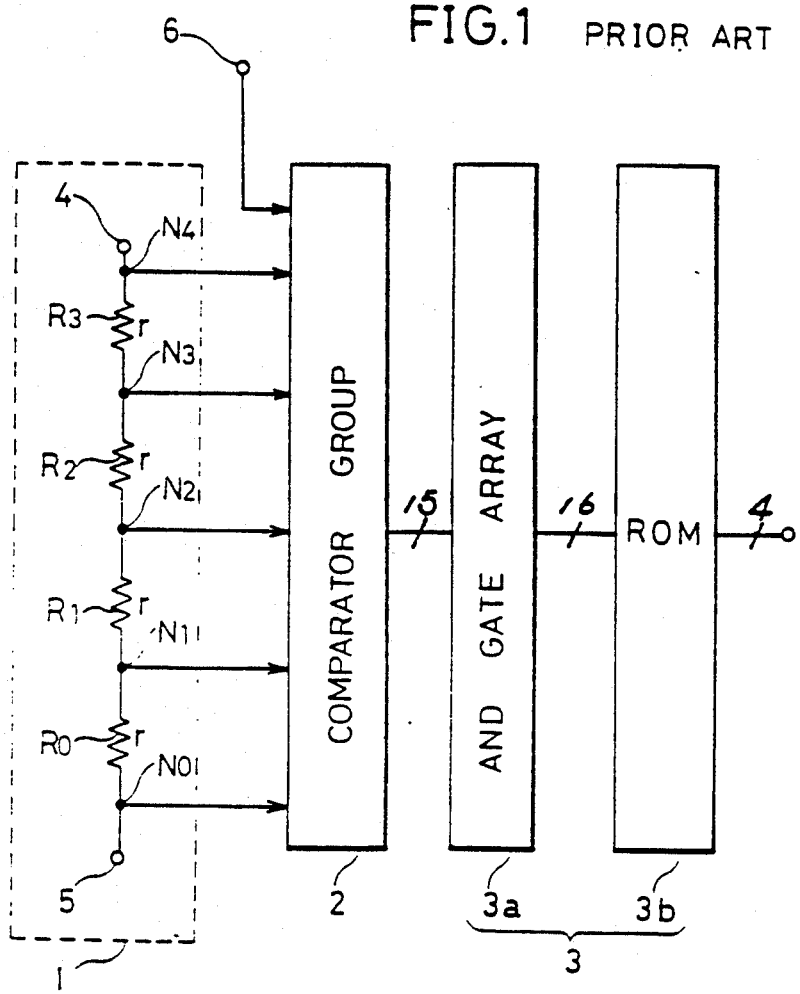
FIG. 1 schematically shows a structure of a conventional A/D converter.

Even if the resistor having a resistance of 2r is estimated as two resistors having a resistance of r, the total number of resistors required is $(2l+3n-2)$, and the total number of capacitance required is $(2^m+n)$. Although the number of elements is increased in comparison with the structure of the A/D converter shown in FIGS. 5 and 6 in this case, the voltage attenuation factor in the input node N50 of inverting amplifier 11 becomes $2^m/(2^m+n)$, which is greatly improved in comparison with the voltage attenuation factor of 1/n of the A/D converter shown in FIGS. 5 and 6. The number of component elements of the A/D converter having the structure shown in Figs. 8, 9, 11 and 12 is significantly reduced in comparison with that of a conventional A/D converter of FIGS. 1 and 3.

According to the present invention, a structure is implemented where a voltage is generated that is binary weighted ($\frac{1}{2}^n$) using a resistor network formed with two types of resistances, whereby an analogue input voltage signal is converted into a digital signal using the abovementioned voltage as the reference voltage. It is possible to implement an A/D converter with less number of elements to obtain an accurate A/D converter that occupies a small area and is economical.

Particularly, if a reference voltage generating circuit is implemented employing a resistor string of resistors in series and a resistor network, decrease in voltage shift of the inverting amplifier in the comparator group may be eliminated to obtain an A/D converter of higher precision.

Although the present invention has been described and illustrated in detail, it ia clearly understood that the same is by way of illustration and example only and is not to be taken by way of limitation, the spirit and scope of the present invention being limited only by the terms of the appended claims.

What is claimed is:

1. A A/D converter for converting an input analog signal into a digital signal of n bits where n is an integer, comprising:

a resistor circuit network, formed of a plurality of resistor elements, having a first node supplied with a first reference voltage and a second node supplied with a second reference voltage, said resistor circuit network including n output nodes each of which supplies a voltage $\frac{1}{2}^j$ times the difference between said first reference voltage and said second reference voltage, where j a number identifying each output node is an integer of 1 to n, level detecting means including $2^n-1$ comparator means for detecting the level of said input analog signal at a scale of $2^n$ levels, each of said comparator means bilevel-processing said input analog signal using the sum of the voltages supplied by a unique predetermined set of he nodes of said resistor circuit network as a corresponding third reference voltage, and encoder mans for encoding an output of said level detecting means to provide a digital signal of n bits, wherein each of said comparators comprises capacitor means having a first electrode and a second electrode, selective transmission means for transmitting said input analog signal to said first electrode of said capacitor means at a first phase of a lock signal, and transmitting the sum of voltage signals received from a predetermined set of output nodes of said resistor network circuit to said first electrode of said capacitor means at a second phase of said clock signal, means for amplifying the difference between said second electrode potentials of said first and said second phases of said clock signal of said capacitor means to provide a binary signal, first capacitors for receiving said input analog signal at said first phase of said lock signal, and for receiving a maximum voltage from one of a plurality of corresponding output nodes or said second reference voltage at said second phase of said clock signal, and second capacitors for receiving said second reference voltage at said first phase of said clock signal, and for receiving a voltage from one corresponding output node selected from a plurality of corresponding output nodes or said second reference voltage at said second phase of said clock signal, wherein respective said comparators are supplied with the voltage from the output nodes of a set selected to change by 1 level of said $2^n$ levels at said second phase of said clock signal.

2. The A/D converter according to claim 1, further comprising switching means for connecting at least one of said first capacitors to said second reference potential or an output node.

3. An A/D converter for converting an input analog signal into a digital signal of n bits where n is an integer corresponding to output nodes, comprising:

a first resistor network circuit including a plurality of resistor elements provided between a first node receiving a first reference voltage and a second node, wherein said first resistor network circuit provides voltages equally dividing a potential difference between said first node and said second node, using each connection node of the resistor elements as output nodes, a second resistor network circuit including a plurality of resistor elements and provided between said second node and a third node receiving a second reference potential, said second resistor network circuit providing a voltage $\frac{1}{2^j}$ times the potential difference between said second node and said third node using each connection node of the resistor elements of he second resistor network as output nodes, where j is an integer and $$j = 1 \text{ through } p$$

and where p is an integer corresponding to the output node number of said second resistor network circuit, level detecting means for detecting the level of said input analog signal in $2^n$ levels with voltages from the output nodes of said first and second resistor network circuits, wherein said level detecting means includes a plurality of comparator means for bilevel-processing said input analog signal with the voltage from predetermined output nodes of said first and second resistor network circuits as reference levels, and encoder means for converting an output signal of said level detecting means into a digital signal of n bits.

4. The A/D converter according to claim 3, wherein said first resistor network circuit comprises first resistor elements connected in series between said first and second nodes, and said second resistor network circuit comprises a plurality of second resistor elements including said second node as the output node thereof, and connected so that the resistances between each of the output nodes and said third node viewed from each of the output nodes thereof are all equal.

5. The A/D converter according to claim 3, wherein the resistance between said second and third nodes viewed from said second node of said second resistor network circuit is equal to the resistance of one of said first resistor element.

6. The A/D converter according to claim 1, wherein one side of each said resistor of said second resistor network is connected to said second reference voltage.

7. The A/D converter according to claim 3, wherein each of said plurality of comparator means are supplied in parallel with voltages from the output nodes of said first and second resistor network circuits selected to differ by 1 level in $2^n$ levels with each other.

8. An A/D converter according to claim 3, wherein said level detecting means receives the potential applied at said second reference voltage applying node.

9. An A/D converter according to claim 3, wherein said level detecting means receives a potential applied at said first reference voltage applying node.

10. An A/D converter according to claim 3, wherein the potential applied at said first reference voltage applying node is higher than the potential applied at said second reference voltage applying node.

11. An A/D converter for converting an input analog signal into a digital signal of n bits where n is an integer corresponding to output nodes, comprising:

a first resistor network circuit including a plurality of resistor elements provided between a first node receiving a first reference voltage and a second node, wherein said first resistor network circuit provides voltages equally dividing a potential difference between said first node and said second node, using each connection node of the resistor elements as output nodes, a second resistor network circuit including a plurality of resistor elements and provided between said second node and a third node receiving a second reference potential, said second resistor network circuit providing a voltage $\frac{1}{2^j}$ times the potential difference between said second node and said third node using each connection node of the resistor elements of the second resistor network as output nodes, where j is an integer and $$j = 1 \text{ through } p$$

and where p is an integer corresponding to the output node number of said second resistor network circuit, level detecting means for detecting the level of said input analog signal in $2^n$ levels with voltages from the output nodes of said first and second resistor network circuits, wherein said level detecting means includes a plurality of comparator means for bilevel-processing said input analog signal with the voltage from predetermined output nodes of said first and second resistor network circuits as reference levels, and encoder means for converting an output signal of said level detecting means into a digital signal of n bits,. wherein said first resistor network circuit comprises k first resistor elements connected in series between said first and second odes, where k is an integer nd $2K = n$, and said second resistor network circuit comprises k second resistor elements connected in series between said second and third nodes, and (k−1) third resistor elements connected between the output nodes excluding the resistor connection node closest to said third node and said third node.

12. The A/D converter according to claim 11, wherein each said first resistor element and each said second resistor element has a resistance value of r, and each said third resistor element has a resistance value of 2r.

13. An A/D converter for converting an input analog signal into a digital signal of n bits where n is an integer corresponding to output nodes, comprising:

a first resistor network circuit including a plurality of resistor elements provided between a first node receiving a first reference voltage and a second node, wherein said first resistor network circuit provides voltages equally dividing a potential difference between said first node and said second node, using each connection node of the resistor elements as output nodes, a second resistor network circuit including a plurality of resistor elements and provided between said second node and a third node receiving a second reference potential, said second resistor network circuit providing a voltage $\nu^j$ times the potential difference between said second node and said third node using each connection node of the resistor elements of the second resistor network as output nodes, where j is an integer an dj=1 through p and where p is an integer corresponding to the output node number of said second resistor network circuit, level detecting means for detecting the level of said input analog signal in $2^n$ levels with voltages from the output nodes of said first and second resistor network circuits, wherein said level detecting means includes a plurality of comparator means for bilevel-processing said input analog signal with the voltage from predetermined output nodes of said first and second resistor network circuits as reference levels, and encoder means for converting an output signal of said level detecting means into a digital signal of n bits, wherein each of said plurality of comparator means comprises capacitor means having one electrode and other electrode, selective transmission means for transmitting an input analog signal to said one electrode of said capacitor means at a first phase of a clock signal, and for transmitting the sum of the output voltages from a preselected set of the output nodes of said first and second resistor network circuits at a second phase of said clock signal, bilevel-processing means coupled to said other electrode of said capacitor means for amplifying the voltage difference at said other electrode between said first and second phase of said clock signal to provide a binary signal, wherein said first resistor network circuit comprises said first and second nodes as the output nodes thereof, said capacitor means comprises first capacitor means for receiving said input analog signal at one electrode at said first phase of said clock signal, and for receiving at said one input the sum of the output voltages from a predetermined set of output nodes of said first resistor network circuit at said second phase of said clock signal, and second capacitor means for receiving at one electrode said second reference voltage from said third node as said first phase of said clock signal, and for receiving at said one electrode the sum of the output voltages from a preselected set of output nodes of said second resistor network circuit at said second phase of said clock signal, wherein other electrodes of said first and second capacitor means are coupled commonly to the input of said bilevel-processing means.

14. The A/D converter according to claim 13, wherein said first capacitor means comprises (k+1) first capacitors provided in parallel, each having the same capacitance, where k is an integer and the number of resistor elements included in said first resistor network circuit, and said second capacitor means comprises p second capacitors provided in parallel where p is an integer where k+p=n.

15. The A/D converter according to claim 14, wherein said first and second capacitors comprise a same capacitance.

16. The A/D converter according to claim 13, wherein each said comparator means includes an inverting amplifier, said inverting amplifier being arranged with said first capacitor means and said second capacitor means so that the voltage attenuation factor at the input of said inverting amplifier is $2^m/(2^m+n)$, wherein m is an integer and the number of bits resulting from a capacitor voltage-dividing a resolution level of a resistor string and an is the number of bits resolved from an R/2R resistor network and a coupling capacitor.

17. An A/D converter for converting an input analog signal into a digital signal of n bits where n is an integer corresponding to output nodes, comprising:

a first resistor network circuit including a plurality of resistor elements provided between a first node receiving a first reference voltage and a second node, wherein said first resistor network circuit provides voltages equally dividing a potential difference between said first node and said second node, using each connection node of the resistor elements as output nodes, a second resistor network circuit including a plurality of resistor elements and provided between said second node an a third node receiving a second reference potential, said second resistor network circuit providing a voltage $\nu^j$ times the potential difference between said second node and said third node using each connection node of the resistor elements of the second resistor network as output nodes, where j is an integer and j=1 through p and where p is an integer corresponding to the output node number of said second resistor network circuit, level detecting means for detecting the level of said input analog signal in $2^n$ levels with voltages from the output nodes of said first and second resistor network circuits, wherein said level detecting means includes a plurality of comparator means for bilevel-processing said input analog signal with the voltage from predetermined output nodes of said first and second resistor network circuits as reference levels, and encoder means for converting an output signal of said level detecting means into a digital signal of n bits, wherein p is (n−1).

18. An A/D converter for converting an input analog signal into a digital signal, comprising:

resistor voltage divider network for producing (n+m) reference potentials, where n and ma each are an integer; and a level detecting means for comparing said input analog signal to said (n+m) reference potentials produced by said resistor voltage divider network; p1 said resistor voltage divider network comprising, a first reference voltage applying node, a second reference voltage applying node, (n+m) output nodes for outputting said (n+m) reference potentials, said (n+m) output nodes successively numbered beginning from said second reference voltage applying node, a first resistor circuit network including (m+1) first resistor elements connected in series between said first reference voltage applying node and an n-th output node, each said first resistor element having a resistance value of R, and each connection point between said first resistor elements providing an output node, and a second resistor circuit network including a second resistor element connected between said second reference voltage applying node and first output node, and third resistor elements connected in series between said first output node and said n-th output node, and n fourth resistor elements each connected between an output node of said first through n-th output nodes and said second reference voltage applying node, said second resistor element having a resistance value of 2·R, each said third resistor element having a resistance value of R, each said fourth resistor element having a resistance value of 2·R, and each connection node between said third resistor elements providing an output node.

19. An A/D converter according to claim 18, wherein said second resistor element includes two resistor elements having a resistance value of R and connected in series, a connection node between said two resistor elements provides an output node to said level detection means.

20. An A/D converter according to claim 18, wherein a second reference voltage applied to said second reference voltage applying node is also applied to said level detection means.

21. An A/D converter according to claim 18, wherein a first reference voltage applied to said first reference voltage applying node is also applied to said level detection means.

22. An A/D converter according to claim 18, wherein a first reference voltage applied to said first reference voltage applying node is higher than a second reference voltage applied to said second reference voltage applying node.

23. An A/D converter according to claim 18 wherein said first resistor circuit network extends from 3rd–6th ones of said output nodes.

* * * * *